(12) United States Patent
Woodbury (10) Patent No.: US 9,397,484 B2
(45) Date of Patent: Jul. 19, 2016

(54) METHOD FOR MOUNTING CURRENT SENSORS

(75) Inventor: Jerald R. Woodbury, Beaverton, OR (US)

(73) Assignee: Veris Industries, LLC, Tualatin, OR (US)

( * ) Notice: Subject to any disclaimer, the term of this patent is extended or adjusted under 35 U.S.C. 154(b) by 1048 days.

(21) Appl. No.: 12/939,828

(22) Filed: Nov. 4, 2010

(65) Prior Publication Data
US 2011/0131793 A1   Jun. 9, 2011

Related U.S. Application Data

(60) Provisional application No. 61/285,106, filed on Dec. 9, 2009.

(51) Int. Cl.
| | |
|---|---|
| *H02B 1/04* | (2006.01) |
| *G01R 15/18* | (2006.01) |
| *G01R 11/04* | (2006.01) |
| *H02B 1/044* | (2006.01) |
| *H02B 3/00* | (2006.01) |
| *G01R 21/06* | (2006.01) |
| *H02B 1/015* | (2006.01) |
| *H02B 1/03* | (2006.01) |

(Continued)

(52) U.S. Cl.
CPC *H02B 1/04* (2013.01); *G01R 11/04* (2013.01); *G01R 15/18* (2013.01); *G01R 15/181* (2013.01); *G01R 15/185* (2013.01); *G01R 21/06* (2013.01); *H02B 1/015* (2013.01); *H02B 1/03* (2013.01); *H02B 1/044* (2013.01); *H02B 1/048* (2013.01); *H02B 3/00* (2013.01); *H02G 3/086* (2013.01); *H02G 3/088* (2013.01); *H01H 9/22* (2013.01); *H01H 9/26* (2013.01); *H01H 11/00* (2013.01); *H01H 11/0031* (2013.01); *Y10T 29/4902* (2015.01); *Y10T 29/49002* (2015.01); *Y10T 29/49004* (2015.01); *Y10T 29/49126* (2015.01); *Y10T 29/49826* (2015.01); *Y10T 29/49947* (2015.01); *Y10T 29/49948* (2015.01); *Y10T 29/49963* (2015.01)

(58) Field of Classification Search
CPC ........ G01R 11/04; G01R 15/18; G01R 21/06; G01R 15/181; G01R 15/185; H02B 1/015; H02B 1/03; H02B 1/044; H02B 1/048; H02B 1/04; H02B 3/00; H02G 3/086; H02G 3/088; H01H 9/22; H01H 9/26; H01H 11/00; H01H 11/0031; Y10T 29/49002; Y10T 29/49004; Y10T 29/49126; Y10T 29/4902; Y10T 29/49947; Y10T 29/49948; Y10T 29/49963; Y10T 29/49826
USPC ................ 29/592.1, 593, 830, 602.1, 525.01, 29/525.02, 525.11; 248/205.1, 241, 242, 248/244; 361/601, 620, 624, 664, 668; 439/133; 324/127
See application file for complete search history.

(56) References Cited

U.S. PATENT DOCUMENTS

| | | |
|---|---|---|
| 4,158,810 A | 6/1979 | Leskovar |
| 4,250,449 A | 2/1981 | Shum |

(Continued)

FOREIGN PATENT DOCUMENTS

JP   2013099020 A  *  5/2013

*Primary Examiner* — A. Dexter Tugbang
(74) *Attorney, Agent, or Firm* — Chernoff Vilhauer McClung & Stenzel, LLP (57) ABSTRACT

A plurality of current sensors on a support is attached to bracket which is secured in an electric power distribution panel.

4 Claims, 9 Drawing Sheets

(51) Int. Cl.
*H02G 3/08* (2006.01)
*H02B 1/048* (2006.01)
*H01H 9/22* (2006.01)
*H01H 9/26* (2006.01)
*H01H 11/00* (2006.01)

(56) References Cited

U.S. PATENT DOCUMENTS

| | | | |
|---|---|---|---|
| 4,384,289 A | 5/1983 | Stillwell et al. | |
| 4,413,230 A | 11/1983 | Miller | |
| 4,758,962 A | 7/1988 | Fernandes | |
| 4,872,847 A * | 10/1989 | Fennell et al. | 439/133 |
| 4,887,029 A * | 12/1989 | Hemminger | G01R 15/181 |
| 5,391,983 A | 2/1995 | Lusignan et al. | |
| 5,546,269 A * | 8/1996 | Robinson et al. | 361/668 X |
| 5,936,834 A * | 8/1999 | Polston et al. | H02B 1/03 |
| 6,621,689 B1 * | 9/2003 | Flegel | H01H 9/26 |
| 6,737,854 B2 | 5/2004 | Bruno et al. | |
| 6,809,509 B2 | 10/2004 | Bruno et al. | |
| 6,825,771 B2 | 11/2004 | Bruno et al. | |
| 6,937,003 B2 | 8/2005 | Bowman et al. | |
| 7,075,003 B2 * | 7/2006 | Johnson et al. | 248/205.1 X |
| 7,089,089 B2 | 8/2006 | Cumming et al. | |
| 7,221,145 B2 | 5/2007 | Bowman et al. | |
| 7,230,414 B2 * | 6/2007 | Bruno | 324/127 |
| 7,294,997 B2 | 11/2007 | Kagan | |
| 7,310,049 B2 | 12/2007 | Bowman | |
| 7,330,022 B2 | 2/2008 | Bowman et al. | |
| 7,417,558 B2 | 8/2008 | Lightbody et al. | |
| 7,435,902 B2 * | 10/2008 | Thornton et al. | 361/664 X |
| 7,474,088 B2 | 1/2009 | Bowman et al. | |
| 7,616,433 B2 | 11/2009 | Kagan et al. | |
| 7,904,262 B2 | 3/2011 | Lancaster et al. | |
| 8,116,072 B2 | 2/2012 | Kagan et al. | |
| 8,427,117 B2 | 4/2013 | Trainer et al. | |
| 8,502,554 B2 | 8/2013 | Wilson et al. | |
| 8,587,452 B2 | 11/2013 | Wynans et al. | |
| 2005/0239325 A1 * | 10/2005 | Cook et al. | G01R 11/04 |
| 2010/0039076 A1 | 2/2010 | Trainer et al. | |
| 2012/0268106 A1 | 10/2012 | Blake, Jr. et al. | |
| 2012/0327563 A1 * | 12/2012 | Cook | 361/624 |

\* cited by examiner

FIG. 1

- Prior Art -

METHOD FOR MOUNTING CURRENT SENSORS

CROSS-REFERENCE TO RELATED APPLICATIONS

This application claims the benefit of U.S. Provisional App. No. 61/285,106, filed Dec. 9, 2009.

BACKGROUND OF THE INVENTION

The present invention relates to a power monitoring system and, more specifically, to a method of mounting a plurality of sensors of a power monitoring system in an electric power distribution panel.

Figure 1:
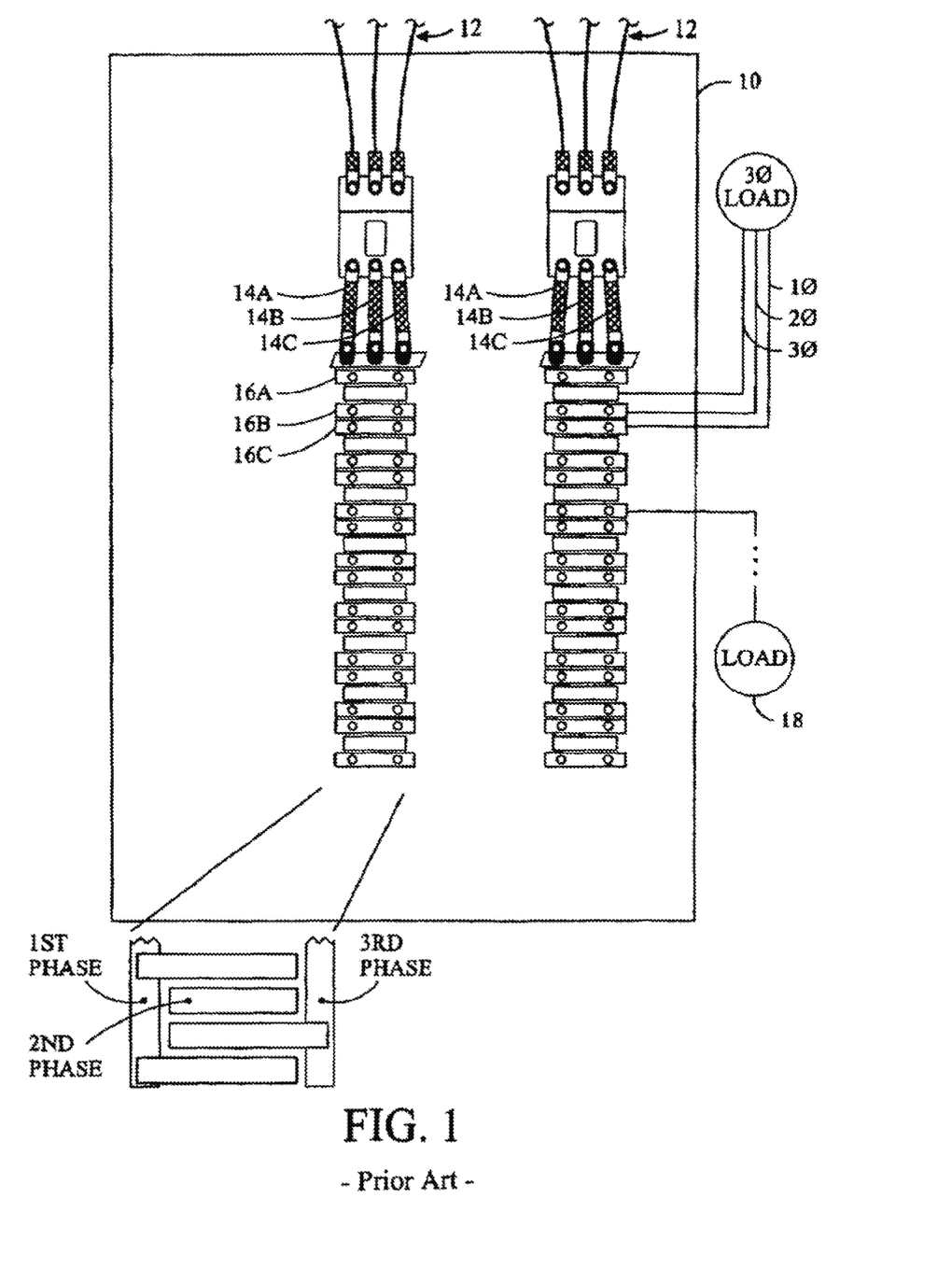
FIG. 1 illustrates a power panel with circuit breakers.

Referring to FIG. 1, many electrical power distribution systems include a panel enclosure 10 into which is provided electrical power using one or more sets of wires 12. The electrical power may have any voltage, any current, and any number of phases (e.g., single phase, two phases, or three phases). Each phase of the electrical power to the power panel is normally provided to a separate bus bar 14a, 14b, and 14c, which are normally elongate conductors within the power panel 10. A plurality of circuit breakers 16a, 16b, 16c, etc., which trip or otherwise selectively disconnect electrical power, are electrically interconnected between one or more of the bus bars 14a, 14b, and 14c, and respective loads 18 external to the power panel 10. In many power panels 10 the circuit breakers 16 are vertically aligned in one or more strips 20 and 22. When the load 18 interconnected to a respective circuit breaker 16 within the power panel 10 draws excessive electrical current then the circuit break 16 trips or otherwise disconnects the electrical power to the load 18. In this manner, if a load shorts and thereafter draws excessive current then the circuit breaker will trip. Frequently, the load will be a three-phase load having three wires provided thereto, with one or more corresponding circuit breakers.

In many business environments a set of electrical loads, such as motors, lighting, heating units, cooling units, machinery, etc., may be electrically interconnected to one or more circuits, each of which may be a single phase or multi-phase. Obtaining the total power usage of the facility may be readily obtained by reading the power meter provided by the electrical utility. The utility's power meter is normally electrically interconnected between the power panel and the utility's transformer. In many circumstances, it is desirable to monitor the power consumption of individual loads or groups of loads. The use of power meters permits effective monitoring of the power consumption of particular loads. Also, a set of power meters permits effective sub-metering of different loads, buildings, or groups of loads to attribute and monitor the power usage of the business. For example, the power sub-metering may be used to attribute the power costs charged by the utility to different buildings, departments, or cost centers. The traditional approach to monitoring such power usage is to install a power meter at a location proximate the load itself. To install a typical power meter on a three phase load, a current sensor is located around each wire of the three phases and a voltage connection is electrically interconnected to each wire. Such a power meter is available from Veris Industries, LLC under the name H8035 Power Meter. Unfortunately, it is burdensome to interconnect a significant number of power meters and in particular the voltage connections to the wires, especially if an interconnection to the wires are not readily available. In addition, it is burdensome to interconnect the output of the power meters, if any, to a computer network because of the need to provide communication wiring or other wireless communication channels to each of the remotely located power meters. Also, installing the power meters requires significant expense for the technician to locate a suitable location near each device, in addition to the further expense of servicing the installed power meters.

What is desired, therefore, is a method for mounting a plurality of current transformers of a power monitoring system in an electric power distribution panel.

DETAILED DESCRIPTION OF PREFERRED EMBODIMENTS

A power distribution panel provides a centralized location where the currents in the wires to several different loads and the voltages in the bus bars that correspond with the currents may be sensed, with both being readily available. Moreover, the voltage potential and phase relationship of the power is the same for each of the multiple different loads connected to a bus bar. In other words the power factor, a phase relationship between the voltage and current supplied to a load, may be determined based on the current to the particular load and the voltage in the respective bus bar. For a plurality of different loads the relationship between the respective currents/voltages and power factor may be determined using the same bus bars. This commonality of voltages among different loads may be used as the basis to simplify the power monitoring system. In particular, the power monitoring system may be substantially improved by sensing the voltage potential together with its phase from each of the bus bars, preferably using one and only one electrical interconnection for each phase. The voltage potential together with its phase relationship sensed from one or more bus bars may be used together with the respective sensed currents provided to the different loads to determine the instantaneous power usage and power consumed over a period of time for any particular load. In this manner, only a single interconnection for sensing the voltage potential is necessary for each phase for multiple loads, each of which may have one or more associated current sensors. The use of a single interconnection for sensing the voltage of each phase for multiple different loads decreases the time for installation, the cost of the power monitoring system, and decreases the likelihood of inadvertently misconnecting the voltage sensing connections. The use of a generally centralized location for sensing the voltage and current for several different loads potentially permits easier connection of the power monitoring system to a computer network for subsequent processing. Moreover, the centralized location reduces the cost by avoiding the need for a technician to locate a suitable location for the power meter for a particular load. Further, the servicing of the power meters is more readily done because of their proximity to one another.

Figure 2:
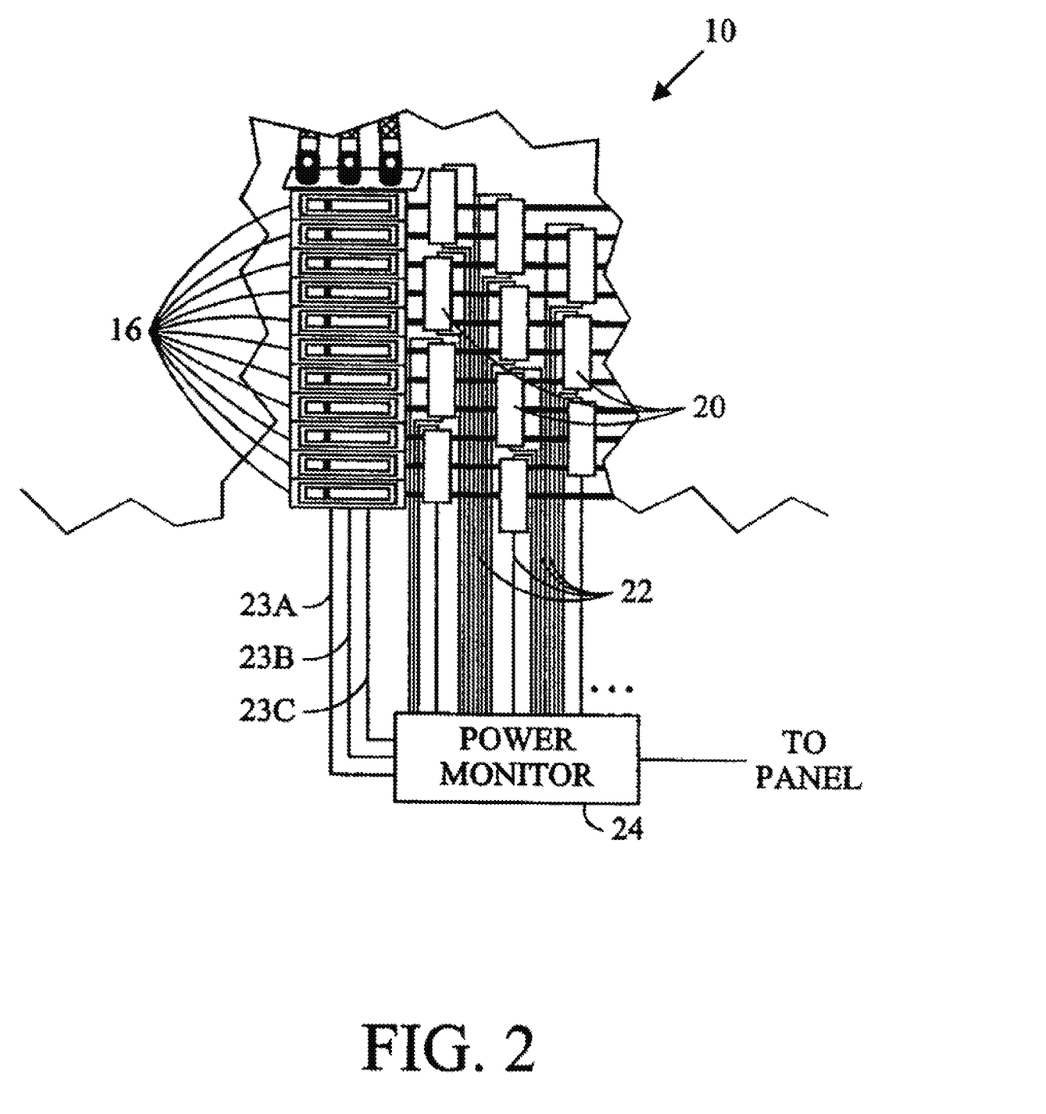
FIG. 2 illustrates circuit breakers, associated sensors, and a power monitor.

Referring in detail to the drawings where similar parts are identified by like reference numerals, and, more particularly to FIG. 2, to monitor the power provided to a particular load from one or more individual circuit breakers 16 a respective current sensor 20 may be interconnected to the wire on the load side of the respective circuit breaker 16. Power conducted by typical circuit breakers may have a single phase, two phases, or three phases. The outputs 22 of each of the current sensors 20 may be interconnected to a power monitor 24. The current sensors 20 may be interconnected to one or more power monitors. Also, the current sensors 20 may likewise be daisy chained together, or interconnected to the power monitor(s) in any other suitable manner. An electrical interconnection from each bus bar to the power monitor(s) normally includes wires 23a, 23b, 23c to sense the voltage and its corresponding phase relationship. Alternatively, the voltage potential and phase relationship for each phase may be sensed from locations other than the bus bars 14a, 14b, and 14c, such as for example, a wire provided to a load, the load side of a circuit breaker, the utility side of a circuit breaker, a capacitive coupling to the voltage potential, or the wire connection from the utility. It is to be understood that the power monitor may calculate power based upon a single phase, two phases, and/or three phases, etc., as desired. In essence, the power monitoring system may use the electrical path from the power monitor 24 to the bus bars (or otherwise) of at least one of the phases for a plurality of different loads. Typically, the power is calculated by multiplying the voltage, corresponding current, and corresponding power factor which relates to the phase relationship between the voltage and current.

It takes considerable time to install, at significant expense, all of the individual current sensors 20 and the available space within the power panel 10 may be insufficient for the desired number of current sensors. Also, the limited space available along the circuit breakers 16 may result in significant difficulty installing the current sensors 20, thus requiring lateral spacing of the current sensors and bending the wires from the circuit breakers to different locations within the power panel 10 in an attempt to locate sufficient available space for the current sensors 20. In addition, the large number of wires 22 from the current sensors 20 to the power monitor 24 may require considerable space within the power distribution panel 10. Further, because of the significant number of individual wires 22 an installer has a significant tendency to interconnect the wires 22 to improper places within the power current monitor 24 and in particular to mismatch pairs of wires 22 from the same current sensor 20 rending the current sensors 20 ineffective. Moreover, it is problematic to ensure that the wires 22 indicated by the installer that relate to a particular current sensor 20 actually are interconnected to the desired current sensor 20. In summary, the potential installation problems are significant, especially when the power meter is installed by untrained technicians.

Figure 3:
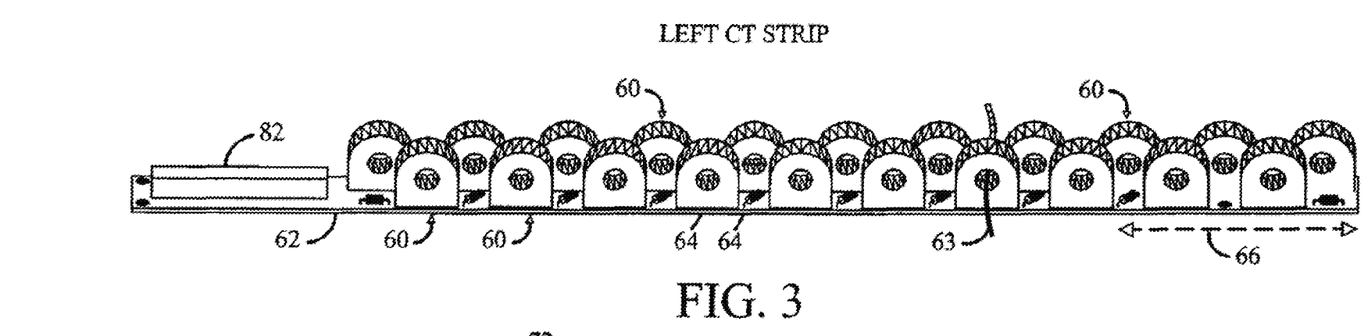
FIG. 3 illustrates a perspective view of an exemplary embodiment of a support for a set of current sensors.

Referring to FIG. 3, sensor assembly 61 may comprise a set of sensors 60 supported by a support 62 which maintains the current sensors 60 in a fixed spatial relationship with respect to one another. Preferably the support 62 is rigid or semi-rigid, while a flexible support 62 that was installed on a rigid or a semi-rigid supporting member(s) may likewise be used. The sensors 60 are preferably current sensors, or alternatively, other types of sensors may be used. The sensors 60 are preferably wire wound toroidal coils on a metallic or non-metallic core enclosed within a plastic housing through which a wire 63 may be extended, and the housings at least partially surround the respective coil. Changing current within the wire 63 induces a changing magnetic field around the wire 63. The changing magnetic field in turn induces a changing current within the wire wound toroidal coil. The changing current within the toroidal coil may be used directly or converted to any suitable signal, such as for example, a voltage signal, or a different current signal.

The openings 64 defined by the sensors 60 are preferably oriented in a substantially parallel relationship with respect to each other and/or oriented in a substantially perpendicular relationship with respect to the longitudinal axis 66 of the support 62 or otherwise the general alignment of the sensors. Preferably, one set of the aligned sensors have a first linear arrangement and another set of the aligned sensors have a second linear arrangement, which may be parallel to each other. Also, preferably at least two of the aligned sensors have a first linear arrangement and at least two others of the aligned sensors have a second linear arrangement. A single aligned set of sensors 60 may be used or more than two sets of sensors 60 may be used, as desired.

Figure 4:
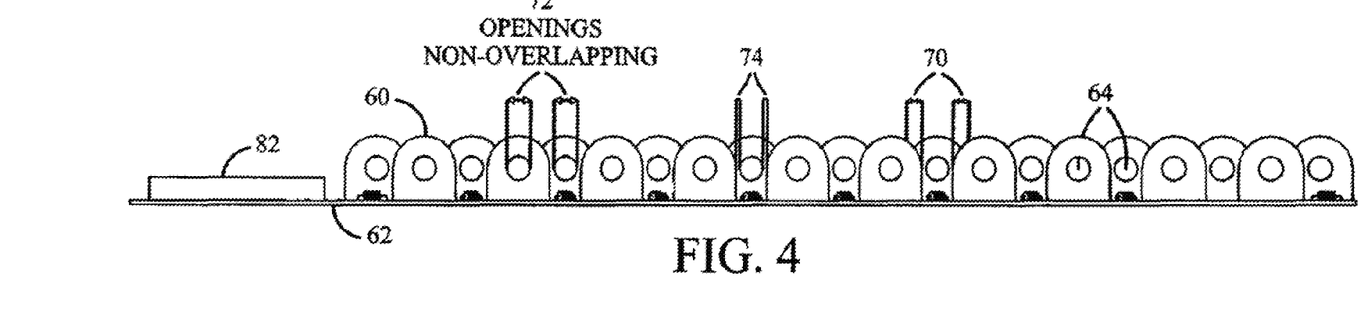
FIG. 4 illustrates a side view of the support and sensors of FIG. 3.

Referring also to FIG. 4, the sensors 60 may be arranged such that the housings surrounding the current sensors have an overlapping region 70 in a substantially perpendicular direction with respect to the longitudinal axis of the support 62 and/or general alignment of the sensors. Preferably, the openings 64 defined by the sensors 60 are in a non-overlapping relationship 72 with respect to one another and a non-overlapping relationship 74 with respect to other housings. This permits the sensors to be arranged in a more compact arrangement within the power panel.

Figure 5:
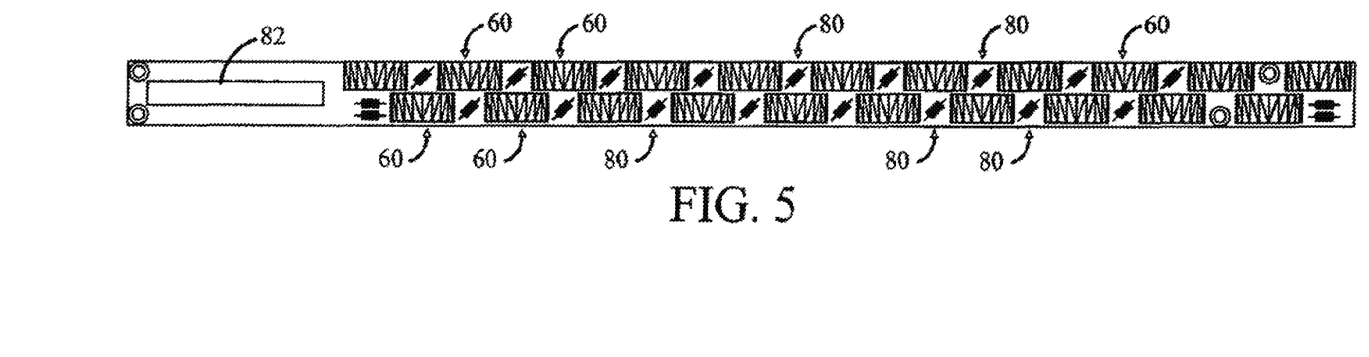
FIG. 5 illustrates a top view of the support and sensors of FIG. 3.

Referring also to FIG. 5, a respective transient voltage suppressor 80 may be interconnected in parallel across the output terminals of each sensor 60. The transient voltage suppressors 80 limits the voltage build up at the terminals of the sensors 60, which may occur if the sensors are sensing a changing magnetic field while the terminals of the sensors 60 are open circuited. This decreases the likelihood that technicians will be the recipient of an unanticipated electrical shock.

Figure 6:
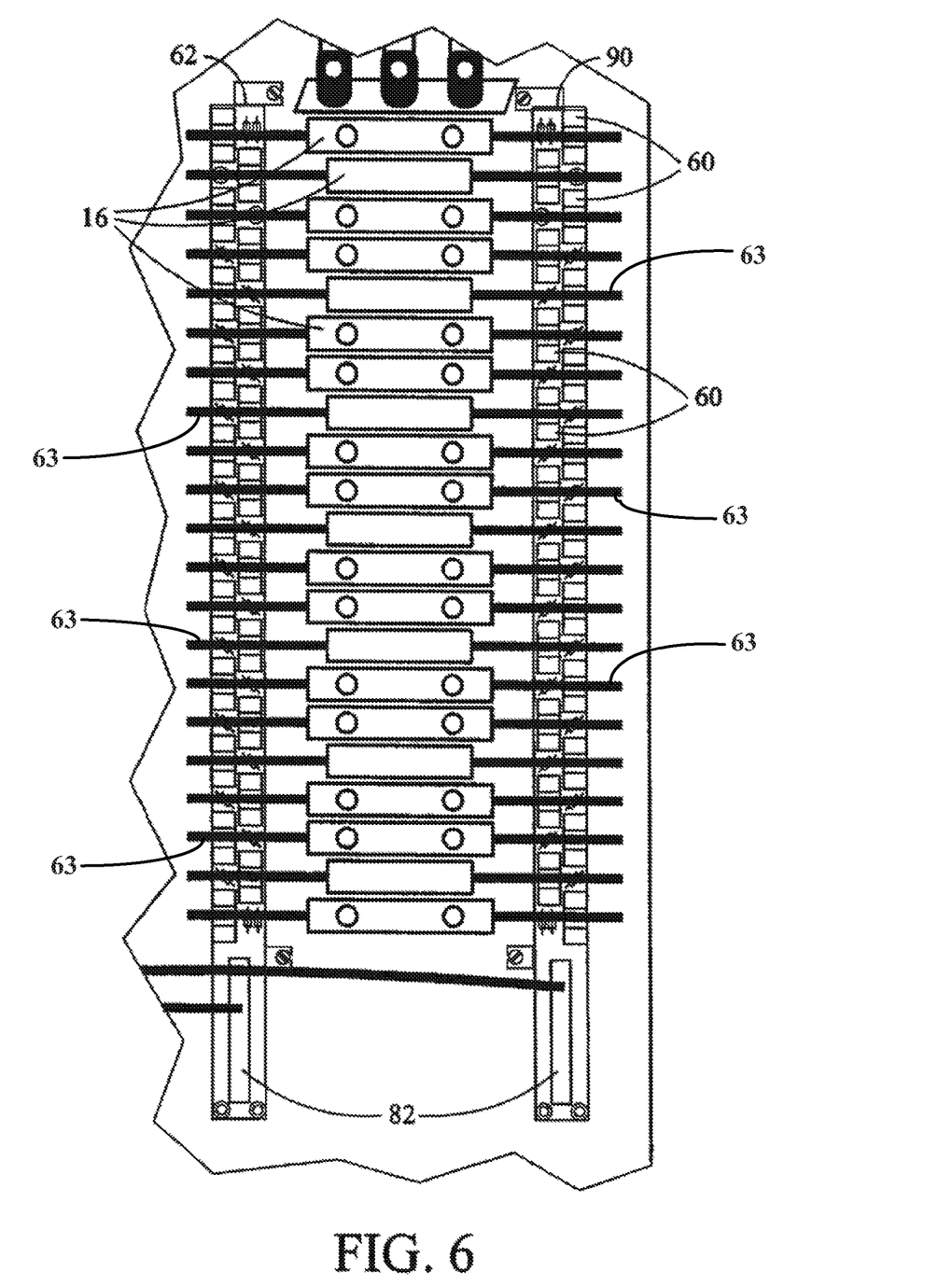
FIG. 6 illustrates a top view of the support and sensors of FIG. 2 together with circuit breakers.
Figure 7:
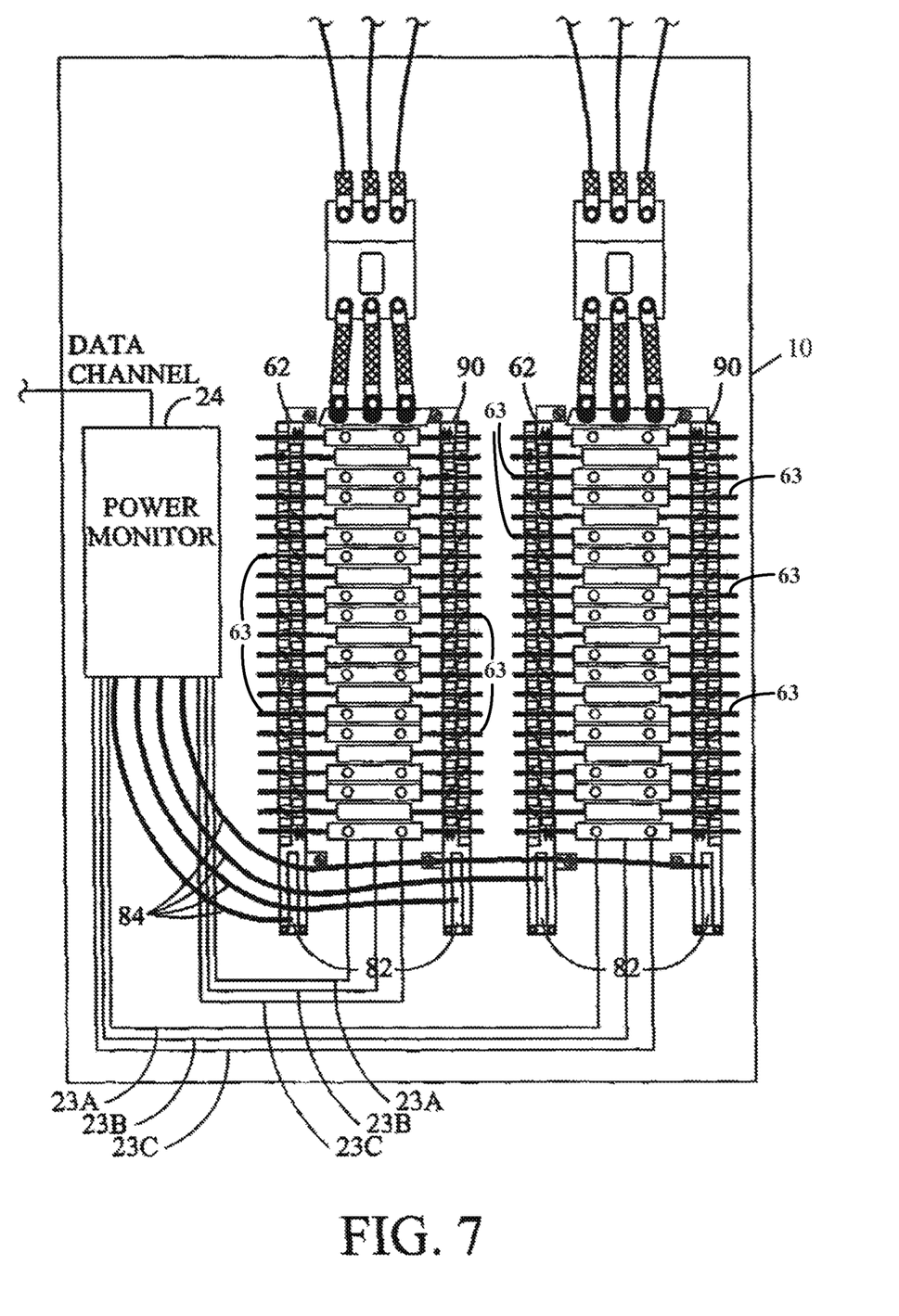
FIG. 7 illustrates a power panel assembly with a power monitor and the support/current sensors of FIG. 3.
Figure 8:
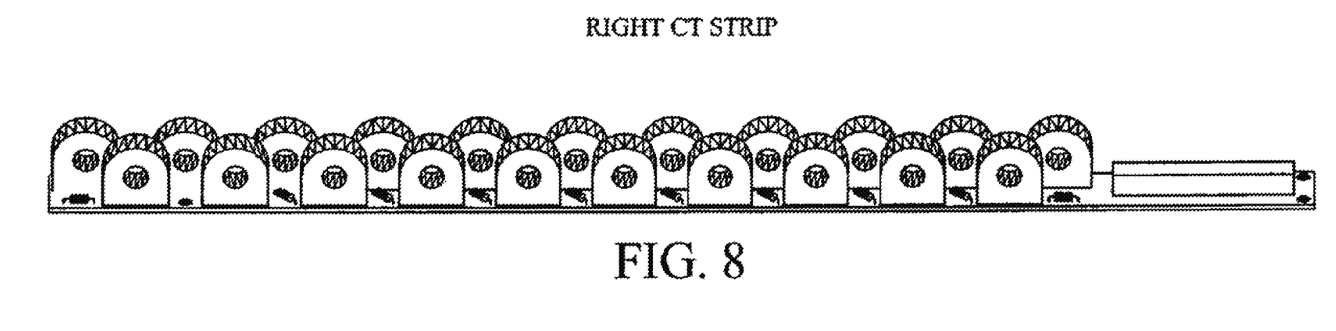
FIG. 8 illustrates a perspective view of another exemplary embodiment of a support for a set of current sensors.
Figure 9:
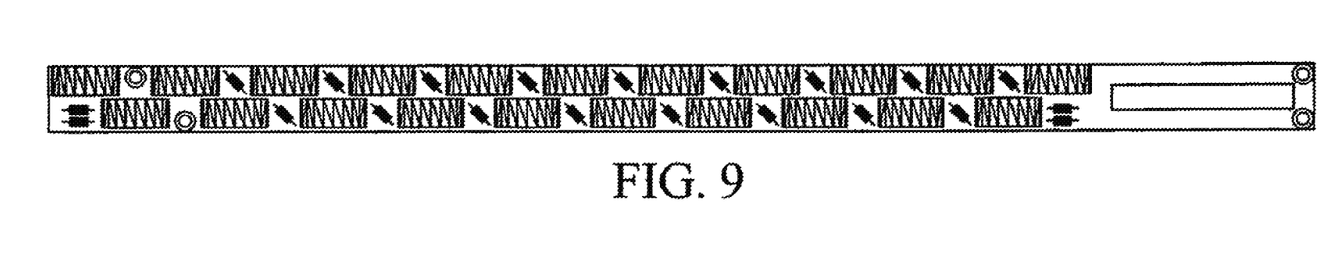
FIG. 9 illustrates a side view of the support and sensors of FIG. 9.
Figure 10:
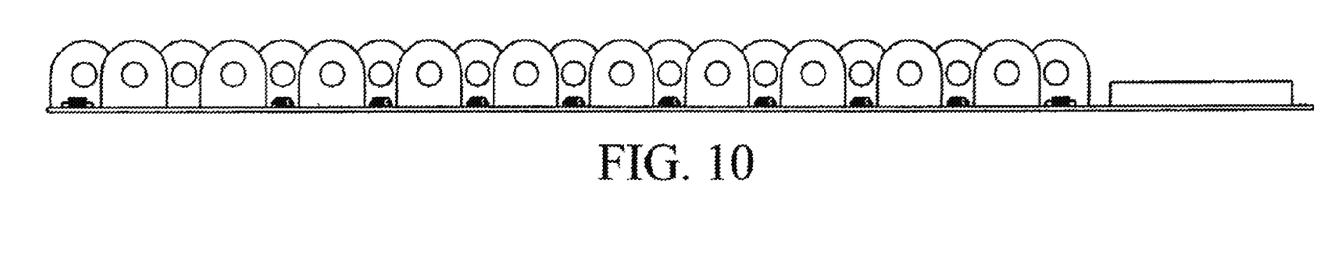
FIG. 10 illustrates a top view of the support and sensors of FIG. 9.
Figure 11:
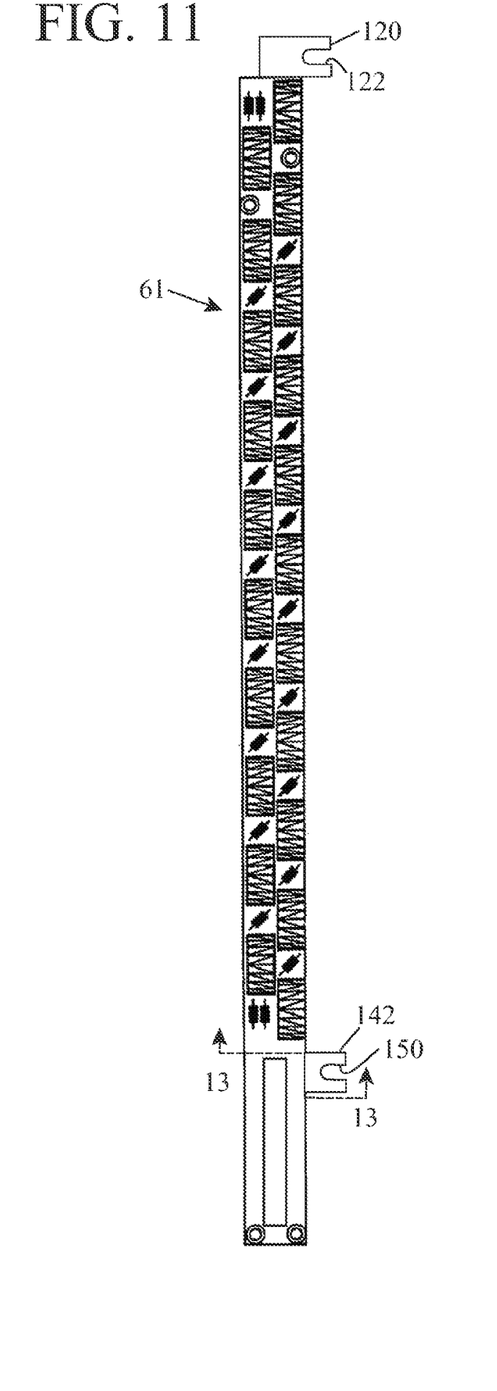
FIG. 11 illustrates a top view of an exemplary sensor assembly and a mounting bracket.
Figure 12:
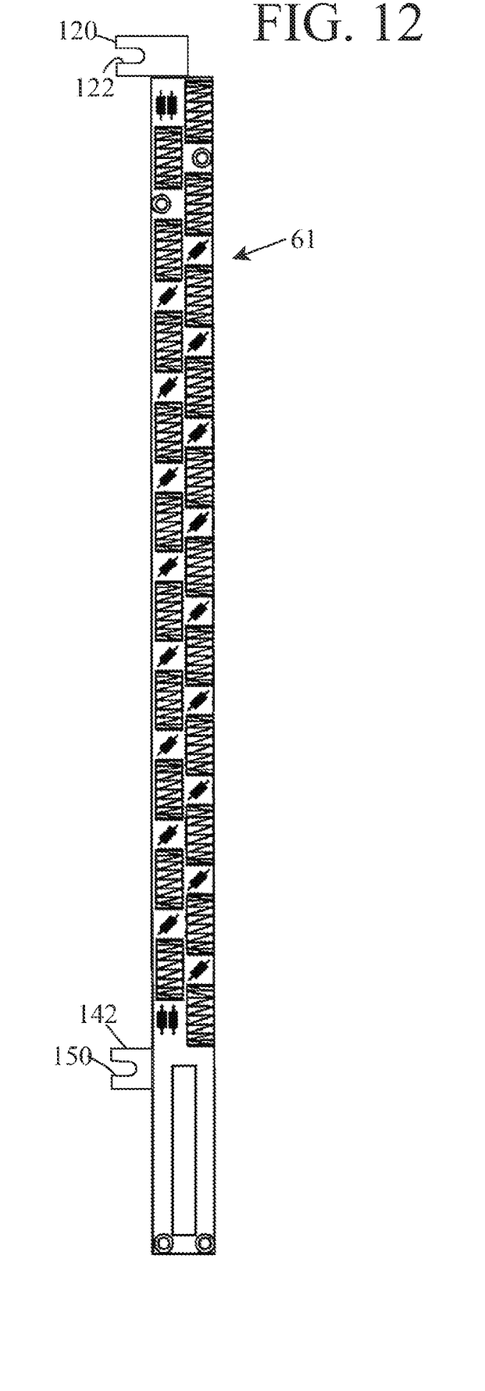
FIG. 12 illustrates a top view of another exemplary sensor assembly and a mounting bracket.
Figure 13:
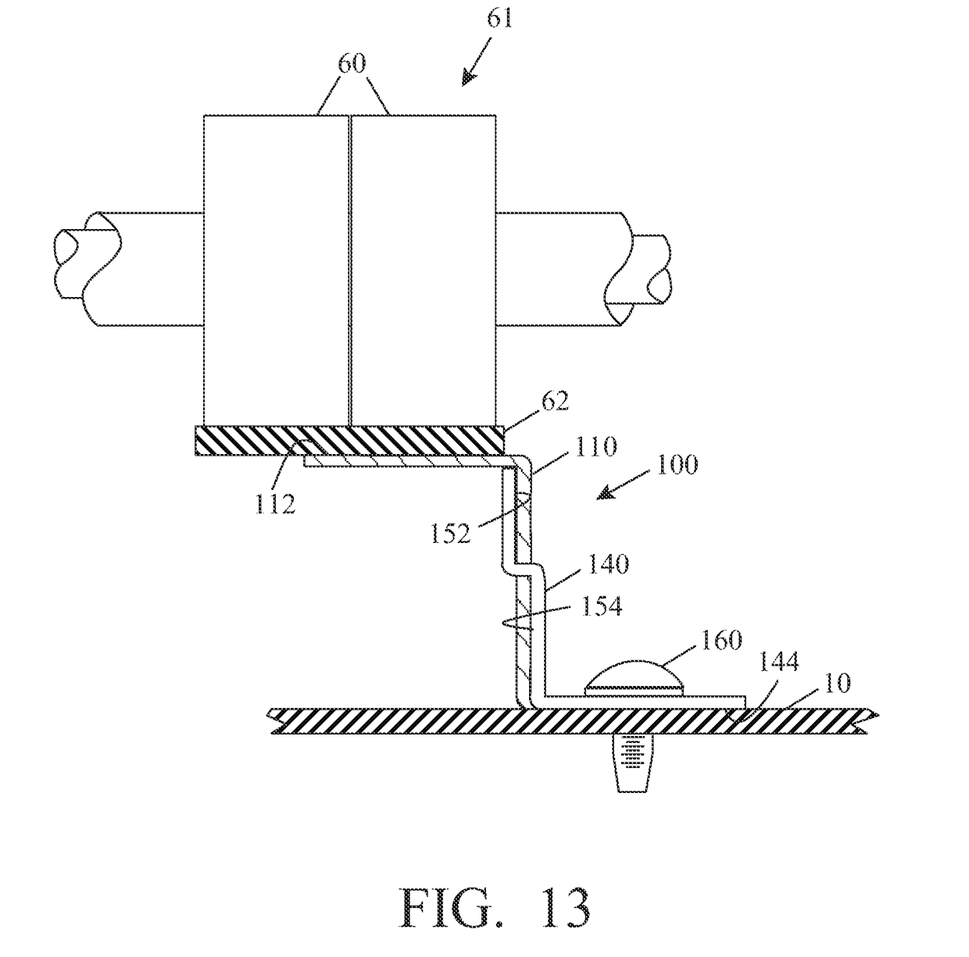
FIG. 13 illustrates a section view of the sensor assembly of FIG. 11 along line 11-11 as mounted in a power distribution panel.
Figure 14A:
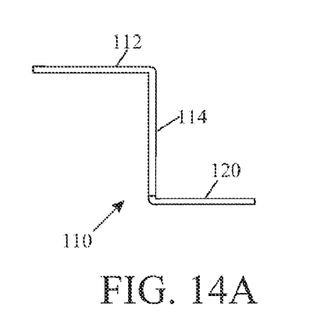
FIG. 14A is an end view of a bracket portion of a sensor assembly mounting bracket.
Figure 14B:
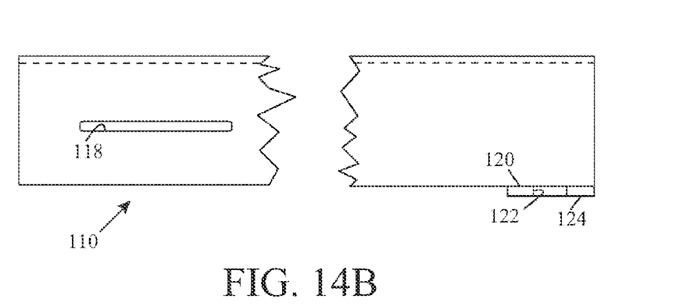
FIG. 14B is an elevation view of the bracket portion of FIG. 14A.
Figures 15A, 15B:
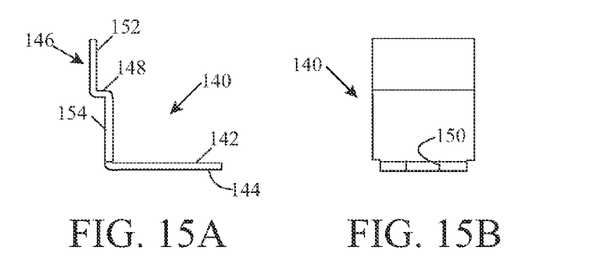
FIG. 15A is an end view of a mount portion of a sensor assembly mounting bracket.
FIG. 15B is an elevation view of the mount portion of FIG. 15A.

Referring to FIG. 6, the current sensors 60 are preferably arranged in a spatial arrangement such that the openings 64 defined by the current sensors 60 are in a substantially directly opposing relationship with respect to the circuit breakers 16. In other words, the each of the openings 64 is opposing a respective circuit breaker 16. In this manner, the wires from the circuit breakers 16 may be readily routed through a respective sensor 60.

Referring to FIGS. 7, 11, 12, and 13 during normal installation the support 62 of the sensor assembly 61 is initially affixed to a mounting bracket assembly 100 which is, in turn, affixed to the power panel 10 in an adjacent spaced apart relationship with respect to a set of circuit breakers 16. Referring also to FIGS. 14A, 14B, 15A and 15B, the mounting bracket 100 preferably comprises an elongate bracket portion 110 that includes a substantially planar, sensor assembly supporting surface 112; a standoff portion 114 arranged substantially normal to the sensor assembly supporting surface, and panel mount 120 which projects normally from the standoff portion 114 and is typically arranged parallel to and spaced apart from the sensor assembly supporting surface 112. The bracket assembly 100 also preferably includes a mount 140 which engages the bracket portion 110 at a slot 118 proximate one end of the bracket portion. The mount 140 includes a first portion 142 including a second mounting surface 144 for engaging the panel and a second portion 146 projecting substantially normal to the first portion. The second portion 146 includes an offset 148 which engages the edges of the slot 118 in the bracket portion 110 when the second portion of the mount is passed through the slot and rotated so that the second mounting surface 144 is co-planar with the first mounting surface 124 of the bracket portion for engaging the surface of the power distribution panel and the front surface 152 of second portion engages the back surface of the standoff portion 114 while the back surface 154 engages the front surface of the standoff portion. The slot 118 in the bracket portion is preferably longer than the width of the mount 140 enabling the distance between screws slots 122, 150 in the first and second mounting surfaces to be adjusted as necessary to align securing screws 160 with mounting holes in the panel. The mounting bracket avoids possible bending and breakage of the support by providing a planar sensor assembly mounting surface, permits securing the sensor assembly to a panel surface which may not be planar over the length of the support and provides a standoff to vertically align the openings 64 in the sensors 60 with the wires connected to the circuit breakers.

A sensor assembly may be located on both sides of a set of circuit breakers 16, if desired. Another sensor assembly is illustrated in FIGS. 8, 9, 10 and 12 suitable for the right hand side of the circuit breakers (FIGS. 3, 4, 5 and 11 are suitable for the left hand side). Then, the wires from the loads are passed through the respective sensors and interconnected to a respective circuit breaker 16. In addition, the wires 23a, 23b, and 23c, for sensing the voltage potentials on the bus bars are likewise electrically interconnected. In this manner, the installation of the circuit breakers and the power monitor is efficient, less expensive, economical, and the sensors are in a suitable position with respect to the respective circuit breakers. The support 62 may be suitable for supporting a set of electrical traces that interconnect the sensors 60 to a connector 82. The interconnection from the sensors 60 to the connector 82 are predetermined so that the signals provided to the connector 82 are readily identifiable to the proper sensor 60. This eliminates the potential possibility of improperly interconnecting the wires from the sensors 60 to the connector. A cable 84 interconnects each connector 82 to a power monitor 24. While such sensor assembly 61 with respective sensors 60 are suitable for use with new installation, it is difficult to install such a set of sensors 60 to an existing set of circuit breakers with wires already installed. To permit the sensors 60 to be readily interconnected with wires already interconnected to the circuit breakers 16 the sensors 60 may be constructed in a split-core manner. In this manner, the opening 64 may be opened, the wire inserted therein, and the opening 64 closed around substantially all of the wire.

To provide effective monitoring of the power usage used by the loads, the power monitor 24 may monitor the current levels of each of circuit breakers 16 together with the associated voltage potential and phase relationship.

The power monitor 24 may likewise be used to monitor the load balance between the different phases of the power panel 10. Frequently, the circuit breakers may be interconnected to a single phase when the loads require 120 volts, interconnected to two phases when the loads require 240 volts, and interconnected to three phases when the loads require three phase power. For example, the first phase of the power panel 10 may be supplying 70 amps, the second phase of the power panel 10 may be supplying 30 amps, and the third phase of the power panel 10 may be supplying 150 amps. This significant imbalance in the current supplied by the different phases is sub-optimal. For example, the greater the current levels the greater the voltage drop from the power source to the power panel, which may result in significant variations in the voltage levels provided to the power panel from the three phase power source. Monitoring the current (or power) provided from each phase using the sensors enables redistribution of the loads between the different phases to re-balance the loads.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

I claim:

1. A method for securing a plurality of sensors in a power distribution panel, said method comprising the steps of:
   (a) supporting at least five toroidal current sensors on a support having a length defining a longitudinal axis where each of said toroidal current sensors defines a respective opening suitable for a respective conductor to pass through for said respective sensor to sense a current therein, where each of said openings are oriented generally perpendicular to said longitudinal axis, where each of said opening is positioned at a spaced apart location along said longitudinal axis along said length of said support;
   (b) securing said support to a substantially planar first surface of a bracket having a mounting surface substantially parallel to said first surface but spaced apart from said first surface in a direction substantially normal to said first surface; and
   (c) securing said bracket to said power distribution panel in a position parallel to branch circuit breakers of said power distribution panel where each of said openings of said toroidal current sensors is laterally spaced apart from a respective branch circuit breaker of said power distribution panel such that a wire extends directly out in a perpendicular direction from said branch circuit breaker and through said respective opening of said toroidal current sensors in a straight line, said mounting surface in contact with said power distribution panel.

2. The method of claim 1 further comprising the steps of:
 (a) engaging a mount with portions of said bracket defining an aperture at a location between said substantially planar first surface and said mounting surface, said mount comprising a second mounting surface; and
 (b) securing said mount to said power distribution panel, said second mounting surface spaced apart from said mounting surface and in contact with said power distribution panel.

3. The method of claim 2 further comprising the step of adjusting a distance between said second mounting surface and said spaced apart mounting surface, said mount slidable with respect to said bracket in said aperture of said bracket.

4. A method for securing a plurality of sensors in a power distribution panel, said method comprising the steps of:
 (a) supporting at least five toroidal current sensors on a support having a length defining a longitudinal axis where each of said toroidal current sensors defines a respective opening suitable for a respective conductor to pass through for said respective toroidal current sensor to sense a current therein, where each of said openings are oriented generally perpendicular to said longitudinal axis, where each of said opening is positioned at a spaced apart location along said longitudinal axis along said length of said support;
 (b) securing said support to a substantially planar first surface of a bracket having a first portion of a mounting surface substantially parallel to said first surface but spaced apart from said first surface in a direction substantially normal to said first surface;
 (c) slidably engaging a mount with portions of said bracket defining an aperture at a location not parallel to said first surface and not parallel to said mounting surface, said mount comprising a second portion of said mounting surface, said second portion of said mounting surface spaced apart a variable distance from said first portion of said mounting surface when said mount is engaged with said bracket; and
 (d) securing said bracket and said mount to said power distribution panel, said first portion of said mounting surface and said second portion of said mounting surface substantially coplanar, where each of said toroidal openings of said current sensors is laterally spaced apart from a respective branch circuit breaker of said power distribution panel such that a wire extends directly out in a perpendicular direction from said branch circuit breaker and through said respective opening of said toroidal current sensors in a straight line, and in contact with said power distribution panel.

\* \* \* \* \*